INVENTOR
JACQUES CAYZAC
CLAUDE DUCOT
BY
Frank R. Trifari
AGENT 3,119,969

MEANS FOR LINEARIZING THE AMPLITUDE CHARACTERISTIC CURVES OF POWER AMPLIFIERS

Jacques Cayzac, Saint-Hilaire, and Claude Ducot, Neuilly, France, assignors to North American Philips Company, Inc., New York, N.Y., a corporation of Delaware Filed Sept. 19, 1961, Ser. No. 139,161
Claims priority, application France Sept. 22, 1960
4 Claims. (Cl. 330—47)

Figure 1:
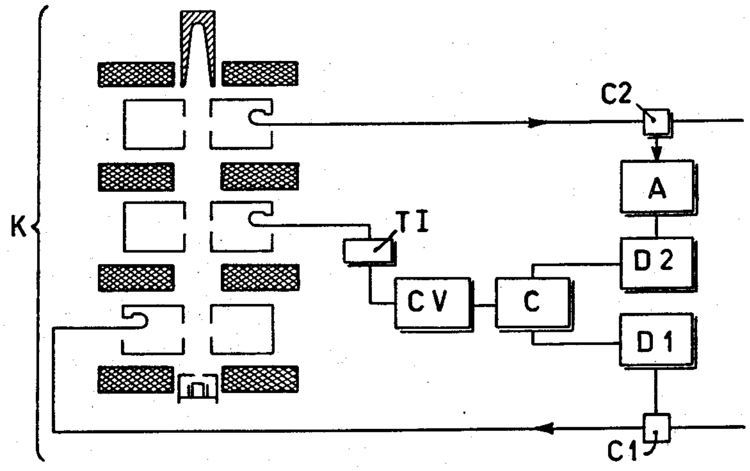

The invention relates to means of linearizing the amplitude characteristic curves of power amplifiers and more particularly to the use of such a method in a klystron amplifier.

It is known to use negative feedback for correcting the distortion due to an amplifier, however, this method has a limitation in that the gain is considerably reduced.

It has also been proposed to compare the input and output levels of the amplifier in order to correct the linearity deviations of the stage. The deviation voltage obtained is employed to control a gain modulator outside the amplifier, which automatically compensates for the gain variations of stage in accordance with the amplitude. However, in the case of high-frequency amplifiers, such a method involves the use of additional high-frequency circuits, and this reduces both the gain and the band width and increases the propagation time.

It is the object of the present invention to obviate these disadvantages.

The invention mainly consists of means for linearizing the amplitude characteristic curve of a power amplifier, in which the input and output energy levels of the amplifier are compared by means of a shunt connected linearizing circuit.

It will be appreciated that the deviation voltage, which brings about the modification of the slope of the amplifier has to be an exact image of the instantaneous value of the distortion due to the amplifier. This distortion can be defined by the difference between the actual level of the output energy and the level of the output energy corresponding to distortionless amplification, or, what amounts to the same thing, by the difference between the input energy and the actual level of output energy converted to a value corresponding to the input energy level.

To this end, the signal furnished by the detector connected to the output of the amplifier is applied to the comparison circuit by way of one or several attenuating circuits having an attenuation factor which permits balancing of the levels of the input and output signals of the amplifier, with due regard to the amplifier gain.

Thus, the amplitude of the deviation voltage furnished by the comparison circuit is representation of the distortion due to the amplifier and provides a corresponding modification of the slope of the amplifier by way of a variable load circuit.

According to another feature of the invention, the variable load circuit may comprise the grid anode space of a triode. In this arrangement the deviation voltage delivered by the comparison circuit is employed to vary the bias voltage applied between the grid and cathode of the triode. The resultant impedance variations brought about at the level of the grid anode space of the triode are employed, by way of a suitable impedance transformer, as load variations, of an intermediate stage of the amplifier.

Figure 2:
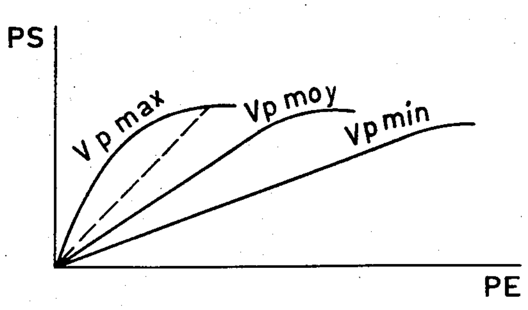

In order that the invention may be readily carried into effect, an embodiment thereof will now be described, by way of example, with reference to the accompanying diagrammatic drawings, in which:

FIGURE 1 is a block diagram of klystron amplifier provided with linearity correction according to the invention; and FIGURE 2 shows a family of curves representing the relations $PS=f(PE)$, where $PS$=output power of the amplifier, and
$PE$=input power of the amplifier, for various values of the bias voltage of the triode used as the variable load.

High-frequency energy to be amplifier (FIGURE 1) is applied through a coupling loop C1 to the input of a klystron K having three cavity resonators. It should be noted that the number of cavities is immaterial and the linearizing circuits described may be used in combination with any klystron.

The amplified energy is derived from the klystron by means of a coupling loop C2. A comparison network is connected in parallel with the klystron, between the input and output coupling loop. The comparison network comprises a first detector circuit D1 connected to the input coupling loop, an attenuator A connected to the output coupling loop, and a second detector D2 connected to the attenuator A. The attenuator A has an attenuation factor so that, with linear amplification in the klystron, the signal outputs of the detectors D1 and D2 are the same at any given input power level.

These signals are applied to a comparison circuit C, which consequently provides a deviation voltage dependent upon the deviation from linearity of the amplifier stage.

This deviation voltage controls a variable load circuit CV which, through an impedance transformer TI, determines the loading of the intermediate cavity of the klystron and appropriately modifies it. Thus, the slope deviation of the tube is directly corrected by variation of the instantaneous value of the overbunching coefficient of an intermediate cavity of the klystron.

The variable load circuit may be constituted, as has been mentioned hereinbefore, by the grid anode space of a triode, the bias of which is furnished by the deviation voltage delivered by the comparison circuit.

From the above description it therefore follows that the bias voltage of the triode constituting the load circuit influences the amplitude characteristic curve of the amplifier stage. FIGURE 2 shows a family of curves obtained by plotting the output energy levels against the input energy levels for three fixed values of the bias voltage. The full line curves representing $PS$ (output power)$=f$ $(PE)$ (input power) for a maximum value, a mean value and a minimum value of the bias voltage $V_p$. This family of curves shows:

(1) That it is possible to determine values of the variable bias voltages such that, for increasing values of the input energy level, a linear amplitude characteristic is obtained (broken-line curve); and (2) That the deviation voltage delivered by the comparison circuit substantially represents the appropriate instantaneous value of the bias voltage, since this deviation voltage results from the difference between the actual output energy level and the output energy level corresponding to distortionless amplification.

It will be seen that it is possible to adapt this circuit so that it is not dependent upon the type of the signals to be transmitted. If the direct-current component has to be passed, it is sufficient to associate with the said circuit a direct-current amplifier connected between the variable load circuit and the control circuit of the amplifier.

It will be appreciated that the above description has only been given as a non-restrictive example and that it may be modified without departing from the scope of the invention. Thus, the method may also be used to correct the linearity deviation of a thermionic valve amplifier comprising several stages and appropriate resonant circuits; it may be used in television, the correction relating to the whole or to part of the video spectrum. Finally, it should be remarked that for less elevated frequencies the load circuit may be constituted by ferrite elements.

What is claimed is:

1. A klystron amplifier system comprising a klystron of the type having at least an input cavity, an output cavity and an intermediate cavity, input circuit means connected to said input cavity, output circuit means connected to said output cavity, and means for linearizing the amplitude characteristic curve of said amplifier system comprising means connected to said input circuit for obtaining a first signal responsive to the amplitude of signals in said input circuit, means connected to said output circuit for obtaining a second signal responsive to the amplitude of signals in said output circuit, comparison means, means applying said first and second signals to said comparison means whereby the output of said comparison means is a deviation voltage having an amplitude that is a function of the deviation of said characteristic curve from a straight line, variable load circuit means connected to said intermediate cavity, and means for applying said deviation voltage to said variable load circuit means for varying the overall gain characteristic of said klystron.

2. A klystron amplifier system comprising a klystron of the type having at least an input cavity, an output cavity and an intermediate cavity, input circuit means connected to said input cavity, output circuit means connected to said output cavity, and means for linearizing the amplitude characteristic curve of said amplifier system comprising means providing a deviation voltage comprising attenuator means connected to said output circuit, first detector means connected to said attenuator means, second detector means connected to said input circuit, and comparison means connected to said first and second detector means to provide said deviation voltage, whereby said deviation voltage varies as a function of the linearity of amplification of said klystron, variable load circuit means connected to said intermediate cavity, and means for applying said deviation voltage to said variable load circuit means whereby the amplitude characteristics of said klystron are substantially linearized.

3. The system of claim 2, in which said variable load circuit means comprises a triode, impedance transformer means for loading said intermediate cavity as a function of the impedance of the grid-anode space of said triode, and means for applying said deviation voltage to the grid of said triode.

4. A klystron amplifier system comprising a klystron of the type having at least an input cavity, an output cavity and an intermediate cavity, input circuit means connected to said input cavity, output circuit means connected to said output cavity, and means for linearizing the amplitude characteristic curve of said amplifier system comprising first and second detector means, means connecting said first detector means to said input circuit, attenuator means connected between said output circuit and said second detector means whereby the outputs of said first and second detectors are equal with linear amplification in said klystron, comprising circiut means connected to said first and second detector means for providing a deviation voltage that varies as a function of the deviation of said characteristic curve from a straight line, variable load circuit means, means for connecting said variable load circuit means to said intermediate cavity, and means for applying said deviation voltage to said variable load circuit means for linearizing the gain characteristic of said klystron.

References Cited in the file of this patent

UNITED STATES PATENTS 2,462,857 Ginzton et al. ............ Mar. 1, 1949